(12) United States Patent
Lee et al.

(10) Patent No.: US 11,538,881 B2
(45) Date of Patent: Dec. 27, 2022

(54) DISPLAY APPARATUS WITH ELECTRODES HAVING LOWERED RESISTANCE

(71) Applicant: Samsung Display Co., Ltd., Yongin-si (KR)

(72) Inventors: Dongmin Lee, Yongin-si (KR); Sukyoung Yang, Yongin-si (KR); Dokeun Song, Yongin-si (KR); Hyuneok Shin, Yongin-si (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 52 days.

(21) Appl. No.: 17/029,843

(22) Filed: Sep. 23, 2020

(65) Prior Publication Data

US 2021/0134916 A1    May 6, 2021

(30) Foreign Application Priority Data

Nov. 4, 2019    (KR) ................. 10-2019-0139738

(51) Int. Cl.
*H01L 27/12* (2006.01)
*H01L 27/32* (2006.01)

(52) U.S. Cl.
CPC ...... *H01L 27/3265* (2013.01); *H01L 27/3248* (2013.01); *H01L 27/3262* (2013.01); *H01L 27/1255* (2013.01); *H01L 27/3211* (2013.01); *H01L 27/3246* (2013.01); *H01L 27/3258* (2013.01); *H01L 2227/323* (2013.01)

(58) Field of Classification Search
CPC ............ H01L 27/3265; H01L 27/3248; H01L 27/3262; H01L 27/3246; H01L 27/3258; H01L 2227/323

USPC .......................................................... 257/71
See application file for complete search history.

(56) References Cited

U.S. PATENT DOCUMENTS

| 7,199,853 B2 * | 4/2007 | Koide ............... G02F 1/136213 349/111 |
| 9,218,081 B2 | 12/2015 | Yamazaki et al. |
| 10,510,900 B2 | 12/2019 | Shin et al. |

(Continued)

FOREIGN PATENT DOCUMENTS

| KR | 10-2006-0118202 | 11/2006 |
| KR | 10-2018-0028084 | 3/2018 |

(Continued)

*Primary Examiner* — Phuc T Dang
(74) *Attorney, Agent, or Firm* — Kile Park Reed & Houtteman PLLC

(57) ABSTRACT

A display apparatus includes a thin film transistor on the substrate, the thin film transistor including a first semiconductor layer and a first gate electrode overlapping the first semiconductor layer wherein a first gate insulating layer is disposed between the first semiconductor layer and the first gate electrode, and a storage capacitor including a lower electrode including a first lower layer and a first upper layer stacked each other and an upper electrode including a second lower layer and a second upper layer stacked each other, wherein the upper electrode overlaps the lower electrode, and a second gate insulating layer is disposed between the upper electrode and the lower electrode, a display element electrically connected to the thin film transistor, wherein the second upper layer has a thickness greater than a thickness of the first upper layer.

13 Claims, 10 Drawing Sheets

(56) References Cited

U.S. PATENT DOCUMENTS

| | | | | |
|---|---|---|---|---|
| 2013/0313529 | A1* | 11/2013 | Kim | H01L 27/1255 |
| | | | | 438/34 |
| 2014/0361272 | A1* | 12/2014 | Joo | H01L 51/5088 |
| | | | | 438/23 |
| 2017/0018652 | A1* | 1/2017 | Liu | H01L 27/1222 |
| 2017/0084680 | A1* | 3/2017 | Lin | H01L 21/02186 |
| 2017/0229554 | A1* | 8/2017 | Choi | H01L 27/124 |
| 2019/0165083 | A1 | 5/2019 | Lee et al. | |
| 2019/0181160 | A1 | 6/2019 | Yamazaki et al. | |
| 2019/0305065 | A1* | 10/2019 | Kim | H01L 27/1222 |
| 2020/0185428 | A1* | 6/2020 | Um | H01L 51/0097 |

FOREIGN PATENT DOCUMENTS

| | | |
|---|---|---|
| KR | 10-2018-0082636 | 7/2018 |
| KR | 10-2019-0062661 | 6/2019 |
| KR | 10-2019-0066085 | 6/2019 |

\* cited by examiner

DISPLAY APPARATUS WITH ELECTRODES HAVING LOWERED RESISTANCE

CROSS-REFERENCE TO RELATED APPLICATION(S)

This application claims priority to and benefits of Korean Patent Application No. 10-2019-0139738 under 35 U.S.C. § 119, filed on Nov. 4, 2019 in the Korean Intellectual Property Office, the entire contents of which are incorporated herein by reference.

BACKGROUND

1. Technical Field

One or more embodiments relate to a display apparatus, and, to a display apparatus having an improved resistance of a gate electrode of a thin film transistor and/or an electrode of a storage capacitor.

2. Description of Related Art

A display apparatus is an apparatus for visually displaying data. A display apparatus may be used as a display in a small-sized product such as a mobile phone, or a display in a large-sized product such as a television.

A display apparatus may include a substrate including a display area and a non-display area. A gate line or gate lines and a data line or data lines may be formed insulated from each other in the display area. Pixel areas may be defined at intersections between the gate and data lines in the display area, and the pixel areas may emit light by receiving an electrical signal to display images to the outside. A thin film transistor and a pixel electrode electrically connected to the thin film transistor may be provided corresponding to each of the pixel areas, and an opposite electrode may be provided commonly with respect to the pixel areas. The non-display area may include various signal lines for transferring electrical signals to the display area, a gate driver, a data driver, or a controller, for example.

Uses of display apparatuses have been increasing as well as design efforts for quality improvement. For example, in the context of a display apparatus having a high resolution, research is being actively conducted to improve quality.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus having an improved resistance of a gate electrode of a thin film transistor and/or an electrode of a storage capacitor. However, the above technical features are exemplary, and the scope of the disclosure is not limited thereto.

Additional aspects will be set forth in part in the description which follows and, in part, will be apparent from the description, or may be learned by practice of the presented embodiments.

According to one or more embodiments, a display apparatus may include a substrate, a thin film transistor on the substrate, the thin film transistor may include a first semiconductor layer, and a first gate electrode overlapping the first semiconductor layer, wherein a first gate insulating layer may be disposed between the first semiconductor layer and the first gate electrode, a storage capacitor including a lower electrode including a first lower layer and a first upper layer stacked each other, and an upper electrode including a second lower layer and a second upper layer stacked each other, wherein the upper electrode may overlap the lower electrode, and a second gate insulating layer may be disposed between the upper electrode and the lower electrode, and a display element electrically connected to the thin film transistor, wherein the second upper layer may have a thickness greater than a thickness of the first upper layer.

The lower electrode and the first gate electrode may include a same material.

The thickness of the first upper layer may be in a range of about 40 nm to about 60 nm, and the thickness of the second upper layer may be in a range of about 40 nm to about 140 nm.

At least one of the first lower layer and the second lower layer may have a thickness in a range of about 130 nm to about 1000 nm.

The first upper layer and the second upper layer may include tantalum (Ta).

The upper electrode may overlap the thin film transistor.

The display apparatus may further include a thin film encapsulation layer or an encapsulation substrate on the substrate, the thin film encapsulation layer or the encapsulation substrate facing the substrate.

The first lower layer and the second lower layer may include aluminum (Al) and an aluminum alloy including a first element, and an amount of the first element may be contained by about 0.1 at % or less.

The first element may be selected from the group consisting of nickel (Ni), palladium (Pd), platinum (Pt), darmstadtium (Ds), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The aluminum alloy may include a second element that may be different from the first element, and a total amount of the first element and the second element may be about 0.1 at % or less.

The first element may be selected from the group consisting of nickel (Ni), palladium (Pd), platinum (Pt), and darmstadtium (Ds), and the second element may be selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

According to one or more embodiments, a display apparatus may include a substrate, a first thin film transistor on the substrate, the first thin film transistor including a first semiconductor layer and a first gate electrode overlapping the first semiconductor layer, wherein a first gate insulating layer may be disposed between the first semiconductor layer and the first gate electrode, and a display element electrically connected to the first thin film transistor, wherein the first gate electrode may include a third lower layer and a third upper layer stacked each other, the third lower layer may include aluminum (Al) and an aluminum alloy including a first element, and an amount of the first element of the third lower layer may be contained by about 0.1 at % or less.

The display apparatus may further include a second thin film transistor on the substrate, the second thin film transistor including a second semiconductor layer and a second gate electrode overlapping the second semiconductor layer, wherein the first gate insulating layer may be disposed between the second semiconductor layer and the second gate electrode. The second gate electrode may include a fourth lower layer and a fourth upper layer stacked each other, the fourth lower layer may include aluminum (Al) and an aluminum alloy including the first element, and an amount of the first element of the fourth lower layer may be contained by about 0.1 at % or less.

The third upper layer may have a thickness greater than a thickness of the fourth upper layer.

The thickness of the third upper layer may be in a range of about 40 nm to about 140 nm, and the thickness of the fourth upper layer may be in a range of about 40 nm to about 60 nm.

At least one of the third lower layer and the fourth lower layer may have a thickness in a range of about 130 nm to about 1000 nm.

The third upper layer and the fourth upper layer may include tantalum (Ta).

The first element may be selected from the group consisting of nickel (Ni), palladium (Pd), platinum (Pt), darmstadtium (Ds), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The aluminum alloy may include a second element that may be different from the first element, and a total amount of the first element and the second element may be about 0.1 at % or less.

The first element may be selected from the group consisting of nickel (Ni), palladium (Pd), platinum (Pt), and darmstadtium (Ds), and the second element may be selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Other aspects, features and advantages of the disclosure will become better understood through the accompanying drawings, the claims and the detailed description.

BRIEF DESCRIPTION OF THE DRAWINGS

The above and other aspects, features, and advantages of the disclosure will be more apparent from the following description taken in conjunction with the accompanying drawings, in which.

DETAILED DESCRIPTION OF THE EMBODIMENTS

Figure 1:
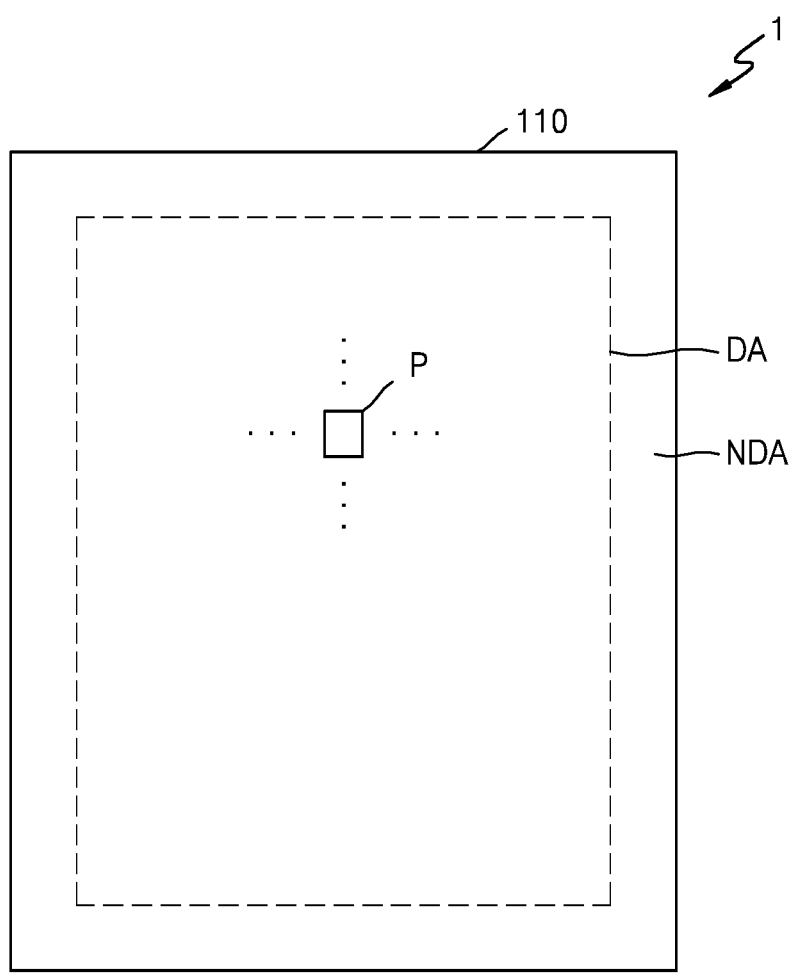
FIG. 1 is a plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The example embodiments will be described below in more detail with reference to the accompanying drawings. Those components that are the same or are in correspondence are rendered the same reference numeral regardless of the figure number, and redundant explanations may be omitted.

While such terms as "first," "second," etc., may be used to describe various components, such components are not to be limited to the above terms. The above terms are used only to distinguish one component from another.

An expression used in the singular encompasses the expression of the plural, unless it has a clearly different meaning in a given context.

In the specification, it is to be understood that the terms "including," "having," and "comprising" and variations thereof are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. For example, intervening layers, regions, or components may be present.

Sizes of components and thicknesses in the drawings may be exaggerated for clarity and convenience of explanation. In other words, since sizes and thicknesses of components in the drawings are arbitrarily illustrated for convenience of explanation, the following embodiments are not limited thereto.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

When an embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, one or more embodiments will be described in detail with reference to the accompanying drawings.

FIG. 1 is a plan view of a display apparatus according to an embodiment.

Referring to FIG. 1, the display apparatus 1 may include a substrate 110, a display area DA in which images may be realized or displayed and a non-display area NDA in which images may not be realized or displayed. The display apparatus 1 may provide images by using light emitted from the display area DA.

In FIG. 1, the display apparatus 1 may include the display area DA having a square shape, however, the disclosure is not limited thereto. The display area DA may have a circular shape, an elliptical shape, or a polygonal shape such as a triangle, a pentagon, for example, within the spirit and the scope of the disclosure. The display apparatus 1 of FIG. 1 may include a flat panel display apparatus, however, the display apparatus 1 may be implemented as various types, for example, a flexible display apparatus, a foldable display apparatus, a rollable display apparatus, for example, within the spirt and the scope of the disclosure.

According to an embodiment, although the display apparatus 1 may be described as being an organic light-emitting display apparatus, the disclosure is not limited thereto. In an embodiment, the display apparatus may include an inorganic light-emitting display (or an inorganic EL display apparatus), or a quantum dot light-emitting display apparatus. For example, a light-emitting layer of a display element included in the display apparatus 1 may include an organic material, an inorganic material, quantum dots, an organic material and quantum dots, an inorganic material and quantum dots, or an organic material, an inorganic material, and quantum dots.

Pixels P may be in the display area DA. In the specification, each pixel P may denote a sub-pixel emitting light of a different color from the others, and each pixel P may be one of, for example, a red (R) sub-pixel, a green (G) sub-pixel, and a blue (B) sub-pixel. For example, each pixel P may include devices such as a thin film transistor (TFT), and/or capacitors, for example, within the spirit and the scope of the disclosure.

The non-display area NDA may not provide images, and may include a scan driver, a data driver, for example. that may provide electric signals to the pixels P of the display area DA and power lines that may provide electric power such as a driving voltage and a common voltage.

Figure 2:
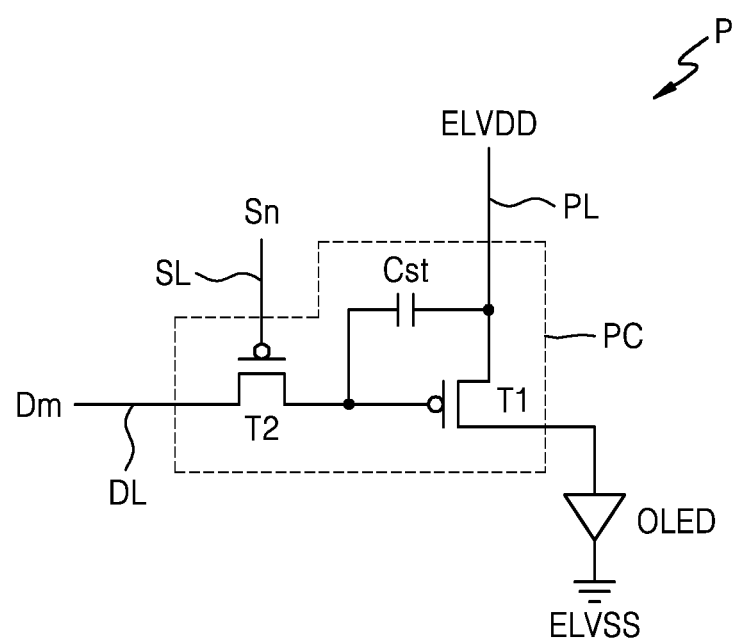
FIG. 2 is an equivalent circuit diagram of a pixel in a display apparatus according to an embodiment.

FIG. 2 is an equivalent circuit diagram of a pixel in the display apparatus according to an embodiment.

Referring to FIG. 2, each pixel P may include a pixel circuit PC electrically connected to a scan line SL and a data line DL, and an organic light-emitting diode OLED electrically connected to the pixel circuit PC.

The pixel circuit PC may include a first thin film transistor T1, a second thin film transistor T2, and a storage capacitor Cst. The second thin film transistor T2, for example, a switching thin film transistor, may be electrically connected to the scan line SL and the data line DL and may transfer a data signal Dm input through the data line DL to the first thin film transistor T1, for example, a driving thin film transistor, according to a scan signal Sn input through the scan line SL.

The storage capacitor Cst may be electrically connected to the second thin film transistor T2 and a driving voltage line PL and may store a voltage corresponding to a difference between a voltage transferred from the second thin film transistor T2 and a driving voltage ELVDD supplied to the driving voltage line PL.

The first thin film transistor T1 may be electrically connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a luminance according to the driving current.

FIG. 2 shows an example in which the pixel circuit PC includes two thin film transistors and one storage capacitor, but one or more embodiments are not limited thereto. For example, the pixel circuit PC may include three or more thin film transistors and/or two or more storage capacitors.

Figure 3:
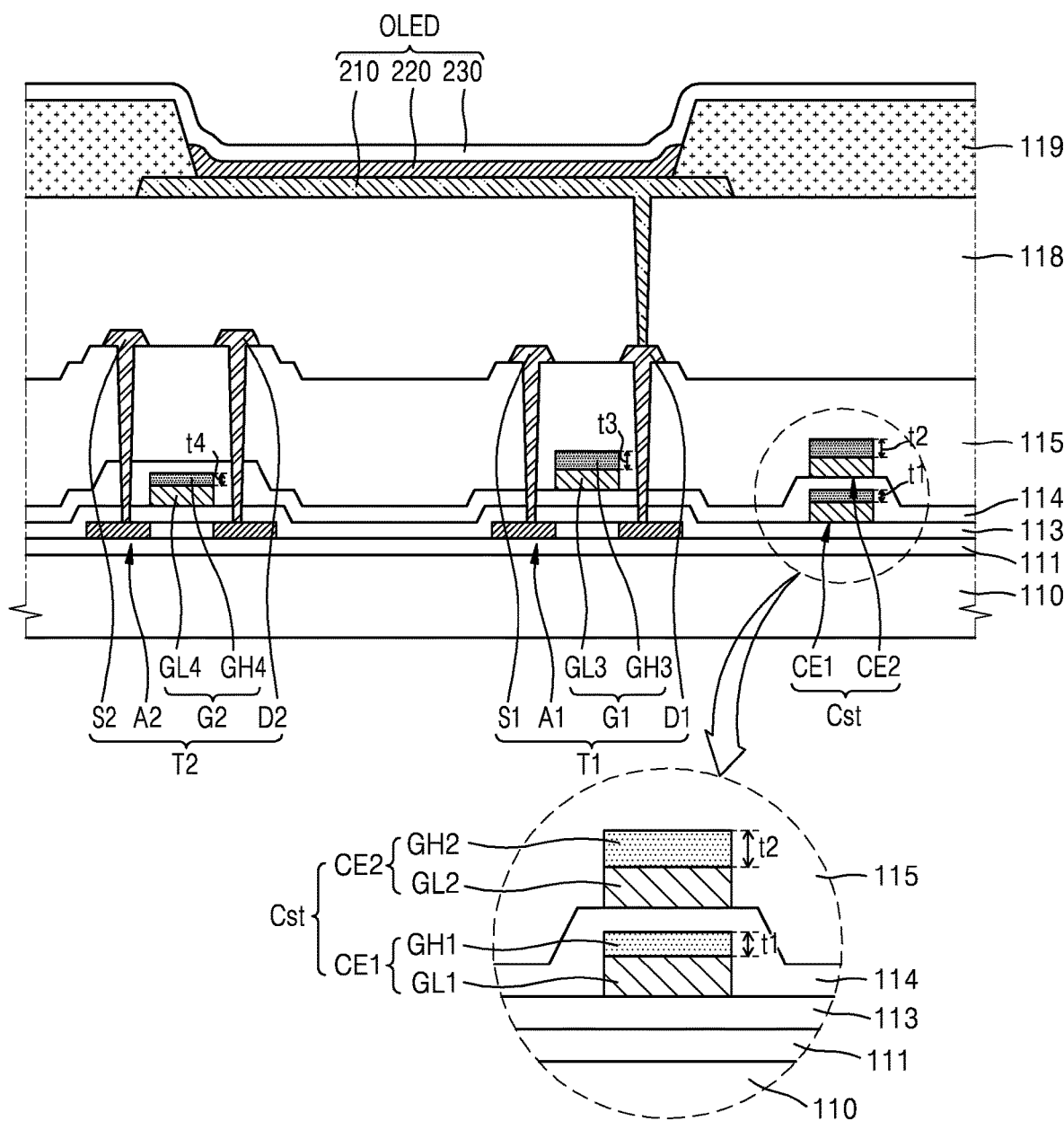
FIG. 3 is a schematic cross-sectional view showing a display apparatus according to an embodiment.

FIG. 3 is a schematic cross-sectional view showing a display apparatus according to an embodiment.

Referring to FIG. 3, the display apparatus according to an embodiment may include the first thin film transistor T1, the storage capacitor Cst, and the organic light-emitting diode OLED that is a display element, on a substrate 110. The display apparatus may include the second thin film transistor T2.

In an embodiment, the storage capacitor Cst may include a lower electrode CE1 and an upper electrode CE2. The lower electrode CE1 may include a first lower layer GL1 and a first upper layer GH1 that may be stacked, and the upper electrode CE2 may include a second lower layer GL2 and a second upper layer GH2 that may be stacked. As an example, a thickness t2 of the second upper layer GH2 may be greater than a thickness t1 of the first upper layer GH1.

According to an embodiment, the first thin film transistor T1 may include a first semiconductor layer A1 and a first gate electrode G1. The first gate electrode G1 may include a third lower layer GL3 and a third upper layer GH3 that may be stacked. In an example, the third lower layer GL3 may include an aluminum alloy including aluminum (Al) and a first element, wherein an amount of the first element may be about 0.1 at % (atomic %) or less.

In an embodiment, the second thin film transistor T2 may include a second semiconductor layer A2 and a second gate electrode G2. The second gate electrode G2 may include a fourth lower layer GL4 and a fourth upper layer GH4 that may be stacked. In an example, the fourth lower layer GL4 may include an aluminum alloy including aluminum (Al) and a first element, wherein an amount of the first element may be about 0.1 at % or less.

Hereinafter, elements included in the display apparatus will be described in detail according to a stacking order with reference to FIG. 3.

The substrate 110 may include a glass material, a ceramic material, a metal material, or a flexible or bendable material or the like within the spirit and the scope of the disclosure. When the substrate 110 is flexible or bendable, the substrate 110 may include a polymer resin such as a polyethersulfone, polyacrylate, polyetherimide, polyethylene naphthalate, polyethylene terephthalate, polyphynylene sulfide, polyarylate, polyimide, polycarbonate, or cellulose acetate propionate.

The substrate 110 may have a single-layered or a multi-layered structure of the above material(s), and the multi-layered structure may include an inorganic layer. In an embodiment, the substrate 110 may have a structure including an organic material/inorganic material/organic material.

A barrier layer (not shown) may be provided, located or disposed between the substrate 110 and a buffer layer 111. The barrier layer may prevent or reduce infiltration of impurities from the substrate 110, for example, into the first semiconductor layer A1 or the second semiconductor layer A2. The barrier layer may include an inorganic material such as an oxide material or a nitride material, an organic material, or an inorganic-organic composite material, and may have a single-layered or multi-layered structure including the inorganic material and the organic material.

The first semiconductor layer A1 and the second semiconductor layer A2 may be on the buffer layer 111. The first semiconductor layer A1 and the second semiconductor layer A2 may include amorphous silicon or polysilicon. In an embodiment, the first semiconductor layer A1 and the second semiconductor layer A2 may each include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), aluminum (Al), cesium (Cs), cerium (Ce), and zinc (Zn).

The first semiconductor layer A1 and the second semiconductor layer A2 may each include a channel region and a source region and a drain region that may be at opposite sides of the channel region. Each of the first semiconductor layer A1 and the second semiconductor layer A2 may have a single-layered or multi-layered structure.

A first gate insulating layer 113 and a second gate insulating layer 114 may be stacked on the substrate 110 to cover or overlap the first semiconductor layer A1 and the second semiconductor layer A2. The first gate insulating layer 113 and the second gate insulating layer 114 may each include an insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

A first gate electrode G1 may be on the second gate insulating layer 114, to at least partially overlap the first semiconductor layer A1. For example, the first gate insulating layer 113 and the second gate insulating layer 114 may be between the first semiconductor layer A1 and the first gate electrode G1. For example, a second gate electrode G2 may be on the first gate insulating layer 113 to at least partially overlap the second semiconductor layer A2. For example, the first gate insulating layer 113 may be between the second semiconductor layer A2 and the second gate electrode G2.

In FIG. 3, the first gate electrode G1 may be on the second gate insulating layer 114, however, in an embodiment, the first gate electrode G1 may be on an upper surface of the first gate insulating layer 113. For example, the second gate electrode G2 may be on an upper surface of the second gate insulating layer 114. The first gate electrode G1 and the second gate electrode G2 may be at the same layer (coplanar) or at different layers (non-coplanar) from each other.

In an embodiment, in the first gate electrode G1, the third lower layer GL3 and the third upper layer GH3 may be stacked, wherein the first lower layer GL3 and the third upper layer GH3 may include different materials from each other. As an example, in the second gate electrode G2, the fourth lower layer GL4 and the fourth upper layer GH4 may be stacked, wherein the fourth lower layer GL4 and the fourth upper layer GH4 may include different materials from each other.

The third upper layer GH3 and the fourth upper layer GH4 may include the same material, for example, titanium nitride (TiN), tantalum (Ta), within the spirit and the scope of the disclosure. The third lower layer GL3 and the fourth lower layer GL4 may include aluminum (Al) or an aluminum alloy.

The lower electrode CE1 of the storage capacitor Cst may be on the first gate insulating layer 113, wherein the lower electrode CE1 may include the same material as that of the second gate electrode G2. For example, the lower electrode CE1 may include the first lower layer GL1 and the first upper layer GH1 stacked each other. The upper electrode CE2 of the storage capacitor Cst may overlap the lower electrode CE1 with the second gate insulating layer 114 therebetween. The upper electrode CE2 may include the second lower layer GL2 and the second upper layer GH2 stacked each other and generate a capacitance. In this case, the second gate insulating layer 114 may function as a dielectric layer of the storage capacitor Cst.

An interlayer insulating layer 115 may be on the second gate insulating layer 114, to cover or overlap the first gate electrode G1 and the upper electrode CE2 of the storage capacitor Cst. The interlayer insulating layer 115 may include an insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

A first source electrode S1 and a second source electrode S2, a first drain electrode D1 and a second drain electrode D2, and a data line DL (see FIG. 2) may be on the interlayer insulating layer 115.

The first source electrode S1, the second source electrode S2, the first drain electrode D1, the second drain electrode D2, and the data line DL may each include a conductive material including molybdenum (Mo), aluminum (Al), copper (Cu), titanium (Ti), for example, and may have a single-layered or multi-layered structure including the above materials. As an example, the first source electrode S1, the second source electrode S2, the first drain electrode D1, the second drain electrode D2, and the data line DL may each have a multi-layered structure including Ti/Al/Ti. The first source electrode S1, the second source electrode S2, the first drain electrode D1, and the second drain electrode D2 may be electrically connected to the source regions or the drain regions of the first semiconductor layer A1 and the second semiconductor layer A2 via contact holes.

The first source electrode S1, the second source electrode S2, the first drain electrode D1, and the second drain electrode D2 may be covered by an inorganic protective layer (not shown). The inorganic protective layer may have a single-layered or multi-layered structure including silicon nitride ($SiN_x$) and silicon oxide ($SiO_x$). The inorganic protective layer may be introduced to cover and protect wirings on the interlayer insulating layer 115.

The planarization layer 118 may be provided to cover or overlap the first source electrode S1, the second source electrode S2, the first drain electrode D1, and the second drain electrode D2, and the organic light-emitting diode OLED may be on the planarization layer 118.

The planarization layer 118 may include a single-layered or multi-layered structure including an organic material and may provide a planarized upper surface. The planarization layer 118 may include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and/or blends thereof.

The organic light-emitting diode OLED may be on the planarization layer 118. The organic light-emitting diode OLED may include a pixel electrode 210, an intermediate layer 220 including an organic light-emitting layer, and an opposite electrode 230.

The pixel electrode 210 may include a (semi-) transmissive electrode or a reflective electrode. In an embodiment, the pixel electrode 210 may include a reflective layer including, but not limited to, Ag, Mg, Al, Pt, Pd, Au, Ni, Nd, Ir, Cr, and/or a compound thereof, and/or a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide, and aluminum zinc oxide (AZO). In an embodiment, the pixel electrode 210 may include ITO/Ag/ITO.

In the display area DA (see FIG. 1) of the substrate 110, a pixel defining layer 119 may be on the planarization layer 118. The pixel defining layer 119 may increase a distance between an edge of the pixel electrode 210 and the opposite electrode 230 on the pixel electrode 210 to prevent generation of arcs at an edge or edges of the pixel electrode 210.

The pixel defining layer 119 may include one or more organic insulating materials selected from the group consisting of polyimide, polyamide, acryl resin, BCB, and phenol resin and may be manufactured by a spin coating method, for example, within the spirit and the scope of the disclosure.

The intermediate layer 220 of the organic light-emitting diode OLED may include an organic light-emitting layer. The organic light-emitting layer may include an organic material including a fluorescent or phosphor material emitting red, green, blue, or white light. The organic light-emitting layer may include a low-molecular weight organic material or a polymer organic material, and functional layers such as a hole transport layer (HTL), a hole injection layer (HIL), an electron transport layer (ETL), and an electron injection layer (EIL) may be arranged, located or disposed under and on the organic light-emitting layer. The intermediate layer 220 may correspond to each of the pixel electrodes 210. However, one or more embodiments are not limited thereto. The intermediate layer 220 may be variously modified, for example, may be arranged, located or disposed throughout the pixel electrodes 210.

The opposite electrode 230 may include a transmissive electrode or a reflective electrode. In an embodiment, the opposite electrode 230 may be a transparent or a semi-transparent electrode, and may be provided as a metal thin film including Li, Ca, LiF/Ca, LiF/Al, Al, Ag, Mg, and/or a compound thereof having a small work function. A transparent conductive oxide (TCO) layer such as ITO, IZO, ZnO, or $In_2O_3$ may be provided over the metal thin film. The opposite electrode 230 may be arranged, located or disposed throughout the display area DA (see FIG. 1), and on the intermediate layer 220 and the pixel defining layer 119. The opposite electrode 230 may be provided integrally with respect to the organic light-emitting diodes OLED to correspond to the pixel electrodes 210.

In an embodiment, the first gate electrode G1, the second gate electrode G2, the lower electrode CE1 and the upper electrode CE2 of the storage capacitor Cst may each have a structure, in which a lower layer and an upper layer may be stacked. This will be described in detail with reference to the structure shown in FIG. 3 and the description given with reference to FIGS. 4 to 6.

Figure 4:
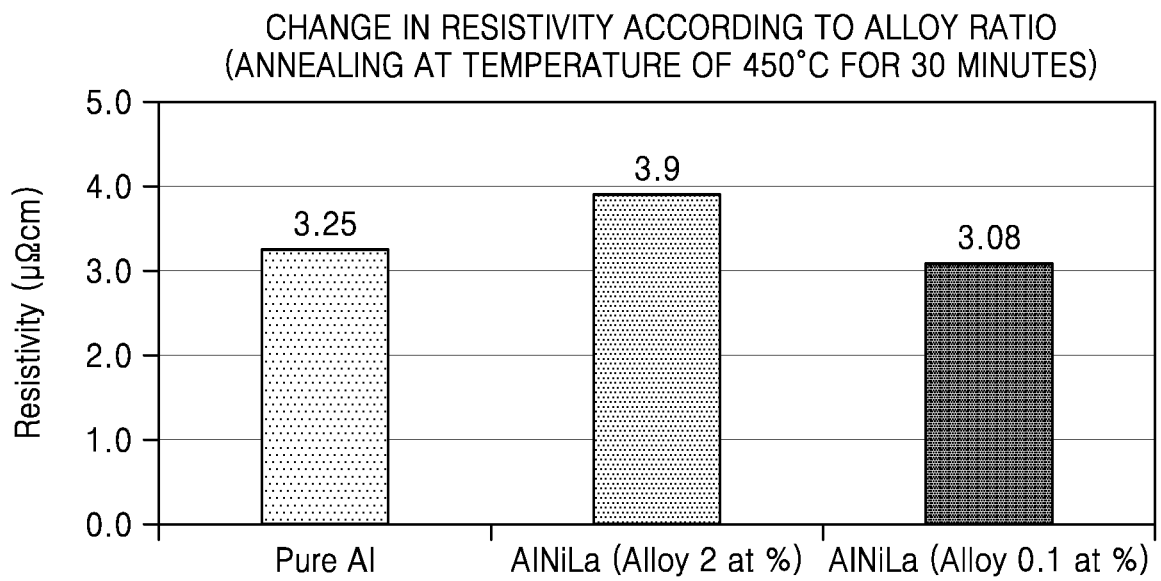
FIG. 4 is a graph showing a change in resistivity versus alloy ratio according to an embodiment.

FIG. 4 is a graph showing a change in a resistivity as a result of annealing at a temperature of about 450° C. for about 30 minutes while changing ratios of a first element and a second element added to an aluminum alloy.

Figure 5:
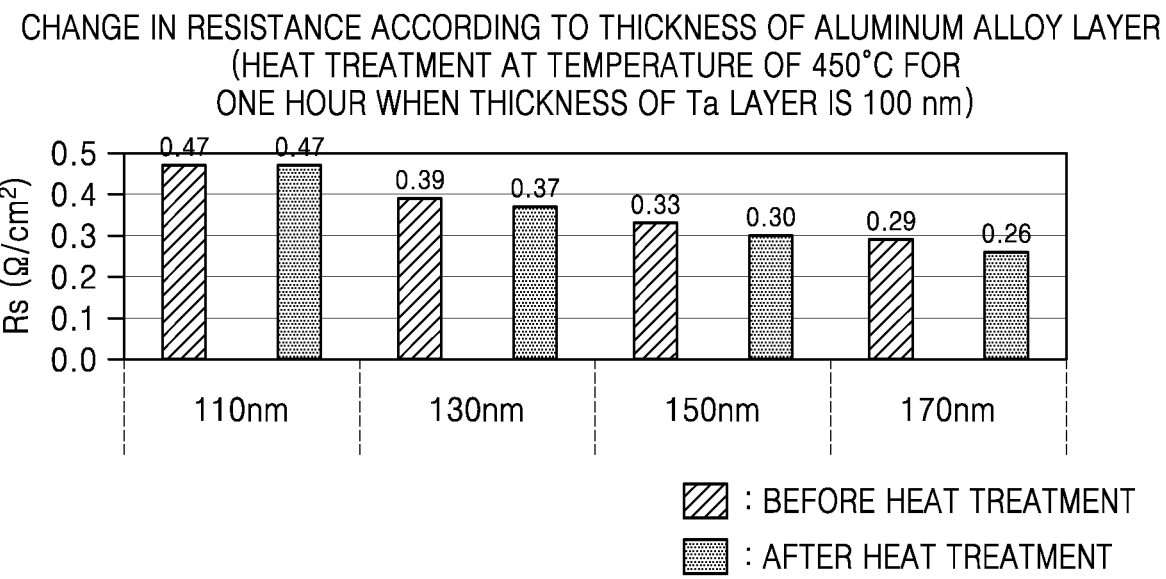
FIG. 5 is a graph showing a change in resistance versus thickness of an aluminum alloy layer according to an embodiment.

FIG. 5 is a graph showing a change in a resistance per unit area ($cm^2$) of the lower electrode CE1 of the storage capacitor Cst according to a thickness of the first lower layer GL1, wherein the storage capacitor Cst may include the first upper layer GH1 including tantalum (Ta) and the first lower layer GL1 including aluminum (Al) or an aluminum alloy.

Figure 6:
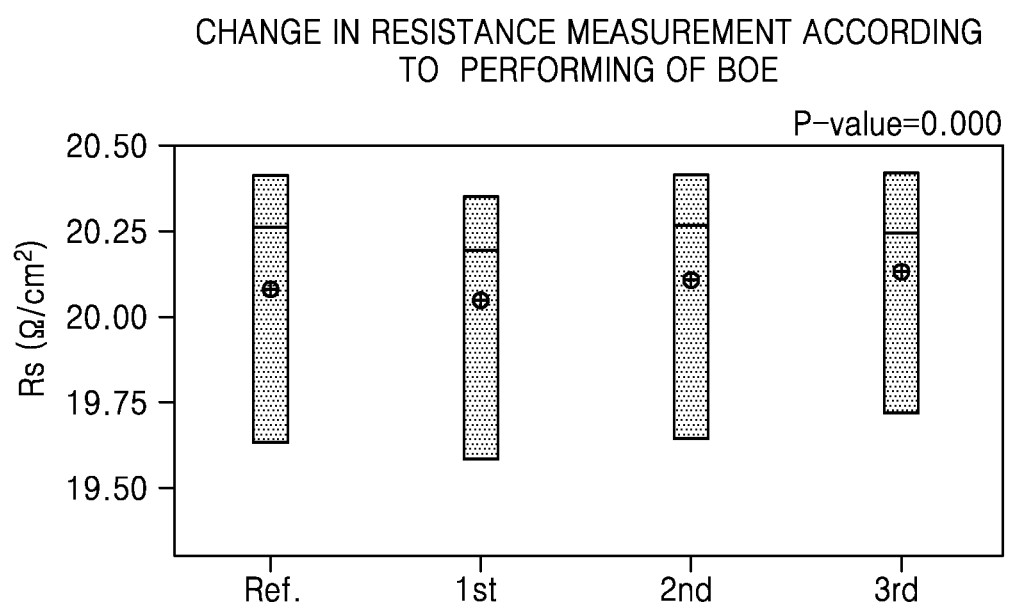
FIG. 6 is a graph showing a change in resistance according to an embodiment.

FIG. 6 is a graph showing a change in a resistance per unit area ($cm^2$) of the first upper layer GH1 in the lower electrode CE1 according to performing of a subsequent buffer oxide etch (BOE) process, in an embodiment in which the first upper layer GH1 includes tantalum (Ta) and the first lower layer GL1 includes aluminum (Al) or an aluminum alloy.

In the first gate electrode G1, the third lower layer GL3 and the third upper layer GH3 may be stacked, wherein the first lower layer GL3 and the third upper layer GH3 may include different materials from each other. For example, in the second gate electrode G2, the fourth lower layer GL4 and the fourth upper layer GH4 may be stacked, wherein the fourth lower layer GL4 and the fourth upper layer GH4 may include different materials from each other. The third upper layer GH3 and the fourth upper layer GH4 may include the same material, for example, titanium nitride (TiN), tantalum (Ta), for example within the spirit and the scope of the disclosure. The third lower layer GL3 and the fourth lower layer GL4 may include aluminum (Al) or an aluminum alloy. A thickness t3 of the third upper layer GH3 may be greater than a thickness t4 of the fourth upper layer GH4.

Similar to the first gate electrode G1 and the second gate electrode G2, the lower electrode CE1 of the storage capacitor Cst may include the first lower layer GL1 and the first upper layer GH1 stacked each other, wherein the first lower layer GL1 and the first upper layer GH1 may include different materials from each other, and the upper electrode CE2 may include the second lower layer GL2 and the second upper layer GH2 stacked each other, wherein the second lower layer GL2 and the second upper layer GH2 may include different materials from each other. The first upper layer GH1 and the second upper layer GH2 may include the same material as each other, for example, titanium nitride (TiN), tantalum (Ta), for example within the spirit and the scope of the disclosure. The first lower layer GL1 and the second lower layer GL2 may include aluminum (Al) or an aluminum alloy. The thickness t1 of the first upper layer GH1 may be greater than the thickness t2 of the second upper layer GH2.

According to an embodiment, the second lower layer GL2 of the upper electrode CE2 in the storage capacitor Cst and the first lower layer GL1 of the lower electrode CE1 in the storage capacitor Cst may each include aluminum (Al) or an aluminum alloy.

The upper electrode CE2 and the lower electrode CE1 of the storage capacitor Cst may include molybdenum (Mo) that may be less damaged due to post-processes. However, in this case, molybdenum (Mo) has a large resistance because a resistivity value is about 570 μΩcm (when the temperature is about 20° C.), and thus display quality may degrade when used in a high-resolution display. For example, when the thickness of the lower electrode CE1 increases to reduce the resistance, tensile stress increases as the thickness increases due to a physical property of molybdenum (Mo) and may cause defects.

However, when the second lower layer GL2 of the upper electrode CE2 and the first lower layer GL1 of the lower electrode CE1 include aluminum (Al) as in an embodiment, a resistivity value of aluminum (Al) may be about 3.25 μΩcm, and thus, low resistance of the lower electrode CE1 may be realized (see FIG. 4). For example, the upper electrode CE2 and the lower electrode CE1 of the storage capacitor Cst including aluminum (Al) may be used in a high-resolution display.

The aluminum alloy included in the first lower layer GL1 may include a first element. In an embodiment, the aluminum alloy in the first lower layer GL1 may include a second element that may be different from the first element. The first element and the second element may be selected from nickel (Ni), palladium (Pd), platinum (Pt), darmstadtium (Ds), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu) (Group 10 elements and lanthanum elements of the periodic table). An additional material such as the first element and the second element may be included in the entire aluminum alloy by about 0.1 at % (atomic %) or less.

Referring to FIG. 4, a resistivity value after a heat treatment in each of the cases of pure aluminum (Al), the aluminum alloy in which the first element and/or the second element is contained by about 2 at %, and the aluminum alloy in which the first element and/or the second element is contained about 0.1 at % may be obtained.

The resistivity value of the pure aluminum (Al) in which the first element and/or the second element is not included may be about 3.25 μΩcm, the resistivity value of the aluminum alloy containing about 2 at % of the first element and/or the second element may be about 3.90 μΩcm, and the resistivity value of the aluminum alloy containing about 0.1 at % of the first element and/or the second element may be about 3.08 μΩcm. For example, when the first element and/or the second element is included in the aluminum alloy by about 0.1 at % or less, the resistivity value of the aluminum alloy may be less than that of the pure aluminum (Al).

In an embodiment, when the first lower layer GL1 includes the aluminum alloy containing about 0.1 at % or less of the first element and/or the second element, hillock may not be generated in a subsequent annealing process and the resistivity value according to the heat treatment at a high temperature may be about 3.08 μΩcm, and thus, low resistance may be realized.

In an embodiment, the first element may be nickel (Ni) and the second element may be lanthanum (La), and a range of about 0.01 at % to about 0.05 at % of nickel (Ni) and a range of about 0.02 at % to about 0.05 at % of lanthanum (La) may form the aluminum alloy.

In an embodiment, the first lower layer GL1 of the storage capacitor Cst may have a thickness in a range of about 130 nm to about 1000 nm.

Referring to FIG. 5, as a result of a heat treatment at a temperature of about 450° C. for about one hour, the resistance per unit area (cm$^2$) after the annealing is reduced when the thickness of the first lower layer GL1 is about 130 nm or greater. When the thickness of the first lower layer GL1 is about 1000 nm or greater, processing defects may occur due to steps formed on the first gate insulating layer 113 and the second gate insulating layer 114. For example, when the thickness of the first gate insulating layer 113 and the thickness of the second gate insulating layer 114 increase in order to reduce the defects caused by the steps, the capacitance of the storage capacitor Cst may be reduced.

The first lower layer GL1 of the lower electrode CE1 in the storage capacitor Cst is described above, but the third lower layer GL3 of the first gate electrode G1, the fourth lower layer GL4 of the second gate electrode G2, and the second lower layer GL2 of the upper electrode CE2 of the storage capacitor Cst may have the same structure as that of the first lower layer GL1.

In an embodiment, the first upper layer GH1 of the lower electrode CE1 in the storage capacitor Cst may include tantalum (Ta). The first upper layer GH1 may include tantalum (Ta) in order to prevent corrosion of the lower electrode CE due to hydrogen fluoride (HF) in a subsequent process, e.g., a cleaning process such as buffer oxide etch (BOE) process. for example, generation of the hillock in aluminum (Al) included in the first lower layer GL1 during the annealing process at a high temperature (for example, in a range of about 400° C. to about 580° C.) may be prevented.

Diffusion of metal components at an interface between the first upper layer GH1 and the first lower layer GL1 may be prevented.

Referring to FIG. 6, The resistance of the first upper layer GH1 per unit area (cm²) may be constantly maintained at about 20 Ω/cm², and thus, the thickness of the first upper layer GH1 may be also constantly maintained. When the third upper layer GH3 and the fourth upper layer GH4 include titanium (Ti), diffusion of the metal components may occur at an interface between the upper layer and the lower layer during the subsequent annealing process. In this case, an aluminum-titanium alloy may be generated at the interface and may cause an increase in the resistance of the lower electrode CE1 of the storage capacitor Cst. Titanium (Ti) may be easily corroded by hydrogen fluoride (HF) that is used as a cleaning liquid in the cleaning process such as the buffer oxide etch (BOE), and accordingly, when the surface of the first lower layer GL1 is exposed and in contact with the hydrogen fluoride (HF), the aluminum component in the first lower layer GL1 may react with the hydrogen fluoride (HF) and the surface of the first lower layer GL1 may be damaged.

However, when the first upper layer GH1 includes tantalum (Ta), diffusion of the metal components at the interface between the first upper layer GH1 and the first lower layer GL1 may not be sufficiently realized. For example, tantalum (Ta) reacts less with hydrogen fluoride (HF) as compared with titanium (Ti), and thus, the surface of the first lower layer GL1 may be protected even when the buffer oxide etch (BOE) cleaning process is performed.

In a comparative example, the lower electrode CE1 of the storage capacitor Cst may include molybdenum (Mo), and in this case, the lower electrode CE1 may not be damaged during the cleaning process such as the buffer oxide etch (BOE) process, however, the resistance may be greatly increased and the lower electrode CE1 may not be used with high resolution. As the thickness of the first lower layer GL1 increases, tensile stress increases due to the physical property of molybdenum (Mo) and may cause defects.

Unlike the above example, according to an embodiment, the lower electrode CE1 may not only include a single layer of molybdenum (Mo), but may include the first lower layer GL1 and the first upper layer GH1. For example, the first upper layer GH1 may include tantalum (Ta), and thus, low-resistance may be realized without being damaged during the cleaning process such as the buffer oxide etch (BOE) process.

Although the first upper layer GH1 of the lower electrode CE1 of the storage capacitor Cst is described above, the third upper layer GH3 of the first gate electrode G1, the fourth upper layer GH4 of the second gate electrode G2, and the second upper layer GH2 of the upper electrode CE2 of the storage capacitor Cst may have the same or similar structures as that of the first upper layer GH1.

Referring to the enlarged view of FIG. 3, the thickness t2 of the second upper layer GH2 of the upper electrode CE2 may be greater than the thickness t1 of the first upper layer GH1 of the lower electrode CE1.

In this case, damage to the first lower layer GL1 and the second lower layer GL2 during a contact hole process, for example, of the first source electrode S1, the second source electrode S2, the first drain electrode D1, and the second drain electrode D2 may be prevented. The thickness t2 of the second upper layer GH2 may be greater than the thickness t1 of the first upper layer GH1, and thus, the second lower layer GL2 of the upper electrode CE2 of the storage capacitor Cst, which may be frequently exposed during the processes, may be protected as the first lower layer GL1 of the lower electrode CE1.

In an embodiment, the thickness t2 of the second upper layer GH2 may be in a range of about 40 nm to about 140 nm and the thickness t1 of the first upper layer GH1 may be in a range of about 40 nm to about 60 nm.

When the thickness t1 of the first upper layer GH1 and the thickness t2 of the second upper layer GH2 are equal to or less than about 40 nm, diffusion of aluminum (Al) may occur at the interface between the first lower layer GL1 and the first upper layer GH1 and the interface between the second lower layer GL2 and the second upper layer GH2 after the annealing process, and boundaries may be vague.

The thicknesses of the second upper layer GH2 and the first upper layer GH1 may respectively be set to be equal to or less than about 140 nm and about 60 nm, taking into account a consumption amount during a dry etching process, in which unnecessary portions may be selectively removed in order to make circuit patterns. When the thicknesses of the second upper layer GH2 and the first upper layer GH1 are respectively equal to or greater than about 140 nm and about 60 nm, unnecessary portions may be generated beyond the original function of the second upper layer GH2 and the first upper layer GH1 for protecting the second lower layer GL2 and the first lower layer GL1, however the resistance may be rather increased.

FIG. 4 is a graph showing a change in resistivity according to an embodiment.

In detail, FIG. 4 is a graph showing a change in a resistivity as a result of annealing at a temperature of about 450° C. for about 30 minutes while changing ratios of a first element and a second element added to an aluminum alloy.

The first element and the second element may be selected from nickel (Ni), palladium (Pd), platinum (Pt), darmstadtium (Ds), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu) (Group 10 elements and lanthanum group elements in the periodic table).

Referring to FIG. 4, a resistivity value after a heat treatment in each of the cases of pure aluminum (Al), the aluminum alloy in which the first element and/or the second element is contained by about 2 at %, and the aluminum alloy in which the first element and/or the second element may be contained by about 0.1 at % may be obtained. The resistivity value is an exclusive value of a material and may be obtained by multiplying the resistance per unit area (cm²) shown in FIGS. 5 and 6 by the respective thickness.

When the additive material such as the first element and the second element may be contained by about 0.1 at % in the entire aluminum alloy, the resistivity value may be the lowest, for example, about 3.08 μΩcm.

In a comparative example, when the aluminum alloy in which the additive material such as the first element and the second element may be contained by about 0.1 at % with respect to the entire aluminum alloy is not used, that is, pure aluminum (Al) is used, hillock of aluminum (Al) may occur in the subsequent annealing process. When the additive material such as the first element and the second element is included in the entire aluminum alloy by about 2 at %, the resistivity value according to the heat treatment may increase.

Thus, in the display apparatus according to an embodiment, the additive material such as the first element and the second element may be included by about 0.1 at % with respect to the entire aluminum alloy in the first lower layer GL1, and in this case, generation of hillock in the subsequent annealing process may be prevented and the resistivity value according to a heat treatment may be rather reduced.

FIGS. 5 and 6 are graphs each showing a change in resistance according to an embodiment.

Referring to FIG. 5, the first upper layer GH1 including tantalum (Ta) may have a thickness of about 100 nm, and the thickness of the first lower layer GL1 including aluminum (Al) or aluminum alloy is about 110 nm, about 130 nm, about 150 nm, and about 170 nm, that is, as the thickness of the first lower layer GL1 increases, the resistance may be gradually reduced to about 0.47 $\Omega/cm^2$, about 0.39 $\Omega/cm^2$, about 0.33 $\Omega/cm^2$, and about 0.29 $\Omega/cm^2$. The first upper layer GH1 including tantalum (Ta) has a resistance of about 20 $\Omega/cm^2$ and the first lower layer GL1 including aluminum (Al) or aluminum alloy has a resistance of about 0.5 $\Omega/cm^2$, and thus, the resistance of the lower electrode CE1, in which the first upper layer GH1 and the first lower layer GL1 may be electrically connected in parallel, per unit area ($cm^2$) may be set according to the resistance of the first lower layer GL1 per unit area ($cm^2$), which may be much less than that of the first upper layer GH1, and the result as shown in FIG. 5 may be obtained.

In a comparative example, when the first upper layer GH1 includes tantalum (Ta) as in an embodiment and the first lower layer GL1 does not include aluminum (Al) or an aluminum alloy, both the first upper layer GH1 and the first lower layer GL1 may have single-layered structures including molybdenum (Mo). In this case, when the thickness of the single layer increases, the tensile stress also increases and causes defects. The first upper layer may include titanium (Ti), not tantalum (Ta), and in this case, diffusion of metal components at the interface may occur during the subsequent annealing process.

Therefore, in the display apparatus of an embodiment, the first upper layer GH1 may include tantalum (Ta) and the first lower layer GL1 may include aluminum (Al) or an aluminum alloy, and then, generation of defects due to an increase in the thickness may be prevented and the resistance per unit area ($cm^2$) after the heat treatment may be rather reduced. Diffusion of the metal components at the interface during the subsequent annealing process may be prevented.

In detail, FIG. 6 is a graph showing a change in a resistance per unit area ($cm^2$) of the first upper layer GH1 in the lower electrode CE1 according to performing of a subsequent buffer oxide etch (BOE) process, in an embodiment in which the first upper layer GH1 may include tantalum (Ta) and the first lower layer GL1 may include aluminum (Al) or an aluminum alloy.

FIG. 6 shows the change in resistance of the first upper layer GH1 per unit area ($cm^2$), wherein the first upper layer GH1 has a thickness of about 100 nm, in the case in which the subsequent buffer oxide etch (BOE) process is not performed (Ref.), is performed once, twice, and three times. When the thickness of the first upper layer GH1 changes, the resistance per unit area ($cm^2$) also changes. In detail, the thickness and the resistance are inversely proportional with each other, that is, the resistance increases when the thickness decreases. However, in FIG. 6, the resistance of the first upper layer GH1 per unit area ($cm^2$) may be constantly maintained at about 20 $\Omega/cm^2$, and thus, the thickness of the first upper layer GH1 may be also constantly maintained. For example, corrosion damage caused by hydrogen fluoride (HF) may be prevented by tantalum (Ta) in the subsequent buffer oxide etch (BOE) process.

In a comparative example, when the first upper layer GH1 includes tantalum (Ta) as in an embodiment and the first lower layer GL1 does not include aluminum (Al) or an aluminum alloy, the first upper layer may include titanium (Ti), and in this case, corrosion caused by hydrogen fluoride (HF) may occur in the subsequent buffer oxide etch (BOE) process.

Thus, in the display apparatus according to an embodiment, when the first upper layer GH1 includes tantalum (Ta) and the first lower layer GL1 includes aluminum (Al) or an aluminum alloy, the corrosion caused by hydrogen fluoride (HF) may be prevented due to tantalum (Ta) in the subsequent buffer oxide etch (BOE) process, and generation of hillock in aluminum (Al) included in the first lower layer GL1 and diffusion of metal components at the interface may be prevented in the subsequent annealing process.

Figure 7:
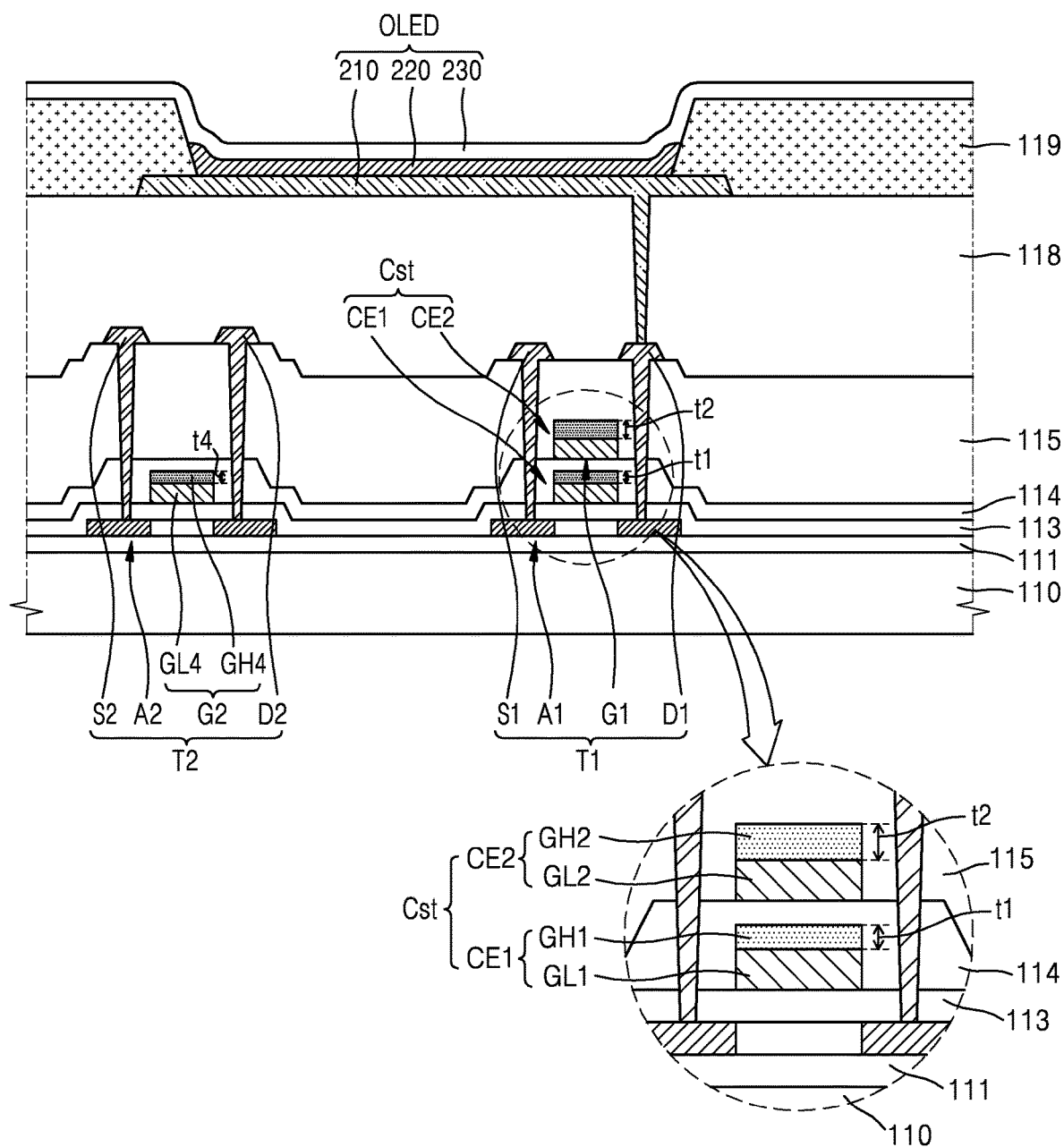
FIG. 7 is a schematic cross-sectional view showing a display apparatus according to an embodiment.

FIG. 7 is a schematic cross-sectional view showing a display apparatus according to an embodiment. In FIG. 7, like reference numerals denote the same elements as those of FIG. 3.

Referring to FIG. 7, in the display apparatus of an embodiment, the storage capacitor Cst may overlap the first thin film transistor T1.

The upper electrode CE2 of the storage capacitor Cst may overlap the first thin film transistor T1. For example, the first gate electrode G1 of the first thin film transistor T1 may function as the upper electrode CE2 of the storage capacitor Cst.

The lower electrode CE1 of the storage capacitor Cst may overlap the upper electrode CE2 with the second gate insulating layer 114 therebetween. In this case, the second gate insulating layer 114 may function as a dielectric layer of the storage capacitor Cst.

The lower electrode CE1 of the storage capacitor Cst may include the first lower layer GL1 and the first upper layer GH1 stacked each other, and the upper electrode CE2 of the storage capacitor Cst may include the second lower layer GL2 and the second upper layer GH2 stacked each other. Referring to the enlarged view in FIG. 7, the thickness t2 of the second upper layer GH2 may be greater than the thickness t1 of the first upper layer GH1.

The first upper layer GH1 and the second upper layer GH2 may include titanium nitride (TiN), tantalum (Ta), for example, and the first lower layer GL1 and the second lower layer GL2 may include aluminum (Al) or an aluminum alloy. The aluminum alloy included in the first lower layer GL1 and the second lower layer GL2 may include a first element. In an embodiment, the aluminum alloy in the first lower layer GL1 and the second lower layer GL2 may include a second element that may be different from the first element. The first element and the second element may be selected from nickel (Ni), palladium (Pd), platinum (Pt), darmstadtium (Ds), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu) (Group 10 elements and lanthanum group elements in the periodic table). An additional material such as the first element and the second element may be included in the entire aluminum alloy by about 0.1 at % or less.

Figure 8:
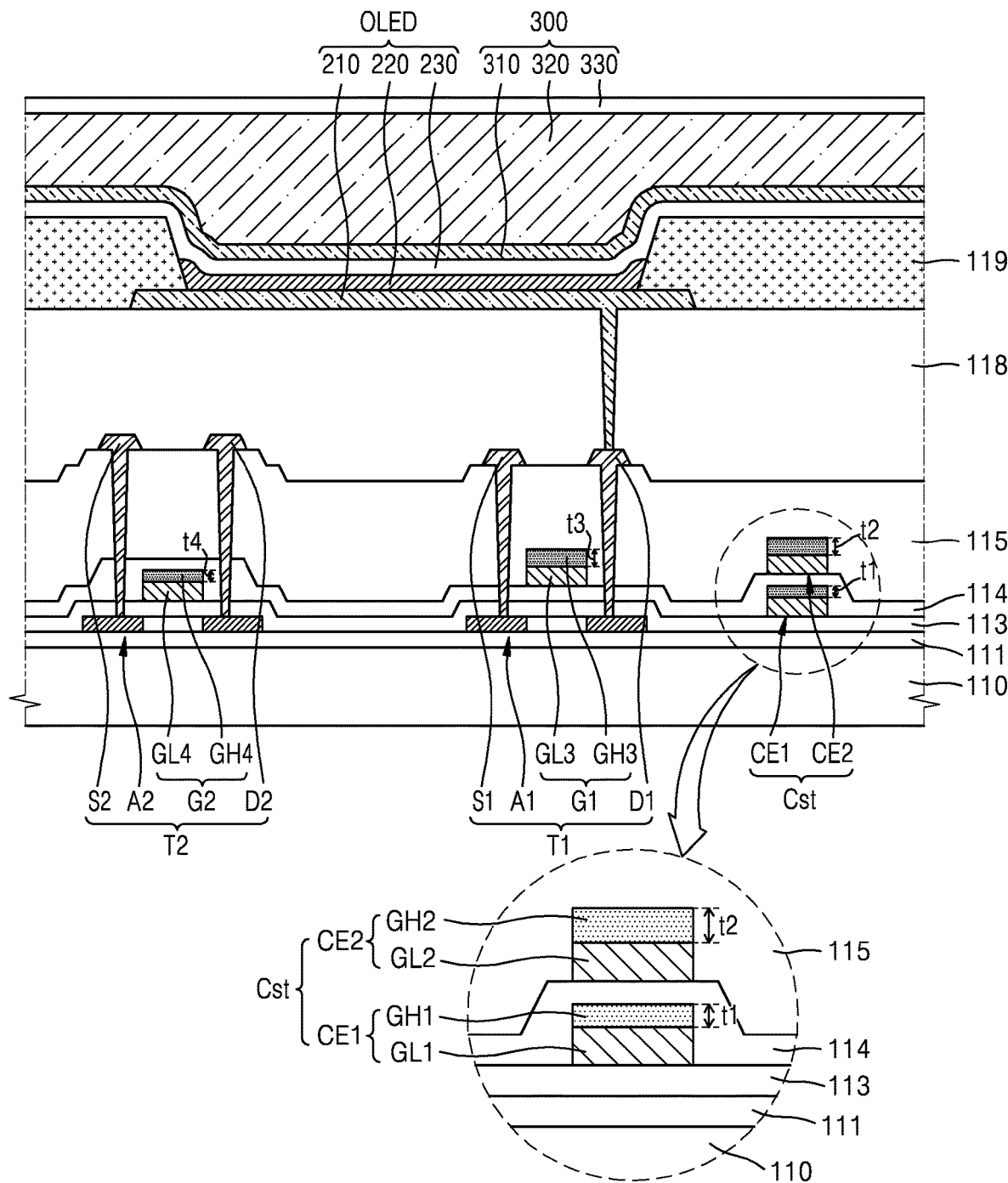
FIG. 8 is a schematic cross-sectional view showing a display apparatus according to an embodiment.
Figure 9:
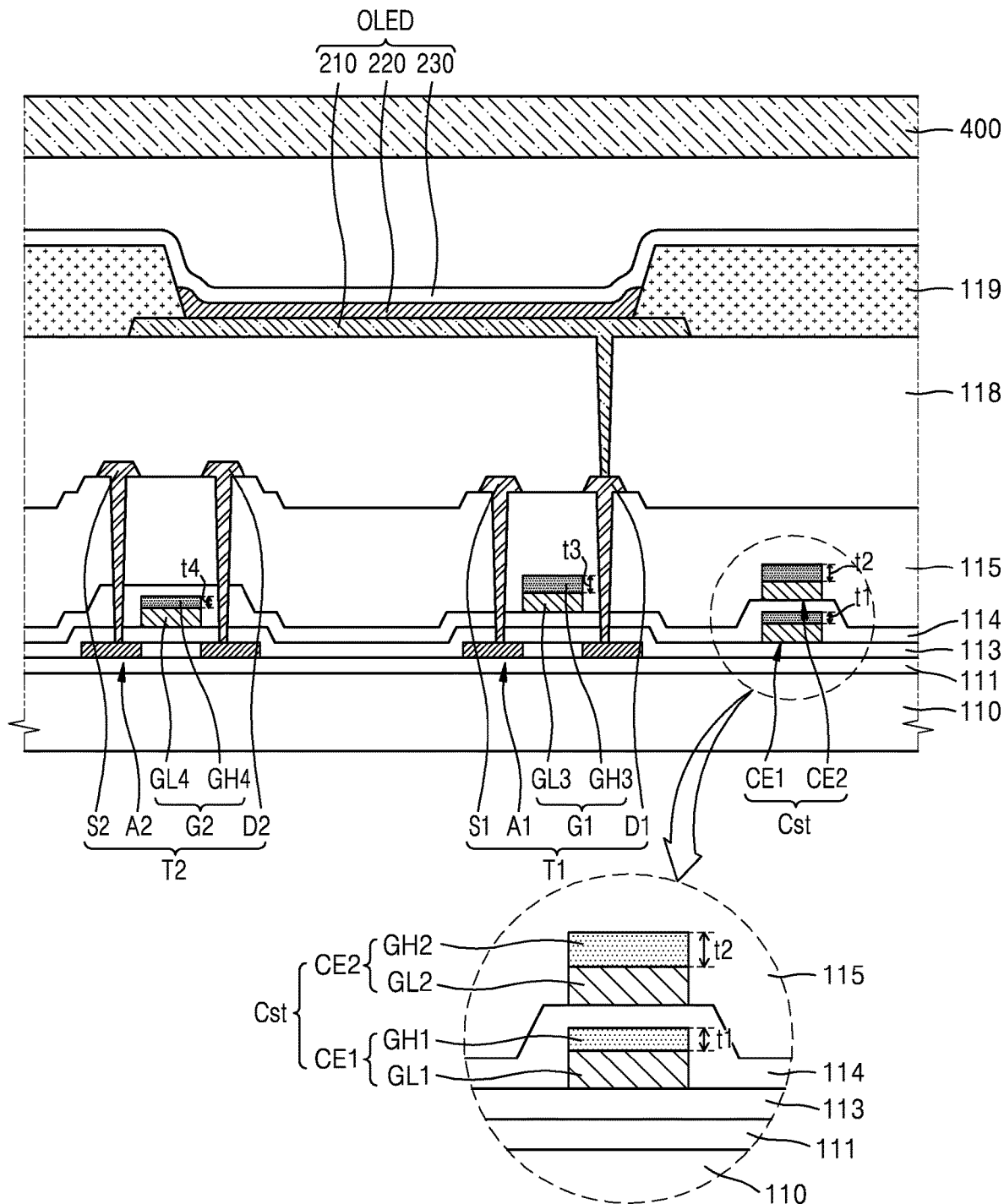
FIG. 9 is a schematic cross-sectional view showing a display apparatus according to an embodiment.

FIGS. 8 and 9 are schematic cross-sectional views showing a display apparatus according to an embodiment. In FIGS. 8 and 9, like reference numerals denote the same elements as those of FIG. 3.

In detail, FIG. 8 is a schematic cross-sectional view showing a display apparatus including a thin film encapsulation layer 300 on the organic light-emitting diode OLED of FIG. 3.

Since the organic light-emitting diode OLED may be easily damaged by external moisture or oxygen, the organic light-emitting diode OLED may be covered and protected by a thin film encapsulation layer 300. The thin film encapsulation layer 300 may cover or overlap the display area DA (the display area, for example of FIG. 1) and may extend to the outside of the display area DA. The thin film encapsulation layer 300 may include at least one organic encapsulation layer and at least one inorganic encapsulation layer. For example, the thin film encapsulation layer 300 may include a first inorganic encapsulation layer 310, an organic encapsulation layer 320, and a second inorganic encapsulation layer 330.

The first inorganic encapsulation layer 310 may cover or overlap the opposite electrode 230 and may include silicon oxide, silicon nitride, and/or silicon trioxynitride. Although not shown in the drawings, other layers such as a capping layer may be provided between the first inorganic encapsulation layer 310 and the opposite electrode 230, if desired within the spirit and the scope of the disclosure. The first inorganic encapsulation layer 310 may be formed along a structure thereunder, and thus, the first inorganic encapsulation layer 310 may have an uneven upper surface. The organic encapsulation layer 320 may cover or overlap the first inorganic encapsulation layer 310, and unlike the first inorganic encapsulation layer 310, the organic encapsulation layer 320 may have a flat upper surface. In detail, the organic encapsulation layer 320 may planarize the upper surface of a portion corresponding to the display area DA. The organic encapsulation layer 320 may include one or more materials selected from the group consisting of polyethylene terephthalate, polyethylene naphthalate, polycarbonate, polyimide, polyethylene sulfonate, polyoxymethylene, polyarylate, and hexamethyl disiloxane. The second inorganic encapsulation layer 330 may cover the organic encapsulation layer 320 and may include silicon oxide, silicon nitride, and/or silicon trioxynitride.

Even when cracks may occur in the thin film encapsulation layer 300, the cracks may be disconnected between the first inorganic encapsulation layer 310 and the organic encapsulation layer 320 or between the organic encapsulation layer 320 and the second inorganic encapsulation layer 330 owing to the multi-layered structure in the thin film encapsulation layer 300. As such, generation of an infiltration path through which external moisture or oxygen may pass to the display area DA may be prevented or reduced.

In detail, FIG. 9 is a schematic cross-sectional view showing a display apparatus including an encapsulation substrate 400 on the organic light-emitting diode OLED of FIG. 3.

Referring to FIG. 9, the display apparatus may include the encapsulation substrate 400 facing the substrate 110. In the non-display area NDA (the non-display area, for example of FIG. 1), the substrate 110 and the encapsulation substrate 400 may be bonded to each other via a sealing material such as a frit, by way of example.

The display device has been described, but the disclosure is not limited thereto. For example, a method of manufacturing the display device may also be included within the scope of the disclosure.

FIGS. 10A to 10E are schematic cross-sectional views illustrating processes in a method of manufacturing a display apparatus in a processing order, according to an embodiment.

Figure 10A:
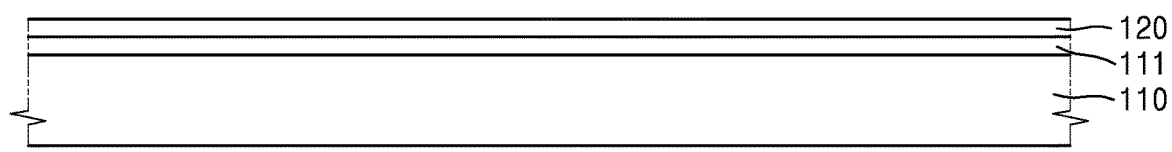
FIGS. 10A to 10E are schematic cross-sectional views illustrating processes in a method of manufacturing a display apparatus in a processing order, according to an embodiment.

Referring to FIG. 10A, the buffer layer 111 and a preliminary-semiconductor layer 120 may be sequentially arranged, located or disposed on the substrate 110.

The buffer layer 111 may include silicon oxide ($SiO_2$) or silicon nitride ($SiN_x$) and may be manufactured by a deposition method such as chemical vapor deposition (CVD) method, a sputtering method, for example, within the spirit and the scope of the disclosure The preliminary-semiconductor layer 120 may include amorphous silicon or oxide semiconductor. The preliminary-semiconductor layer 120 may be deposited by a chemical vapor deposition method. When the preliminary-semiconductor layer 120 includes amorphous silicon, after forming the preliminary-semiconductor layer 120, the preliminary-semiconductor layer 120 may be crystallized by various methods such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) methods, for example. to form a polycrystalline silicon layer.

Figure 10B:
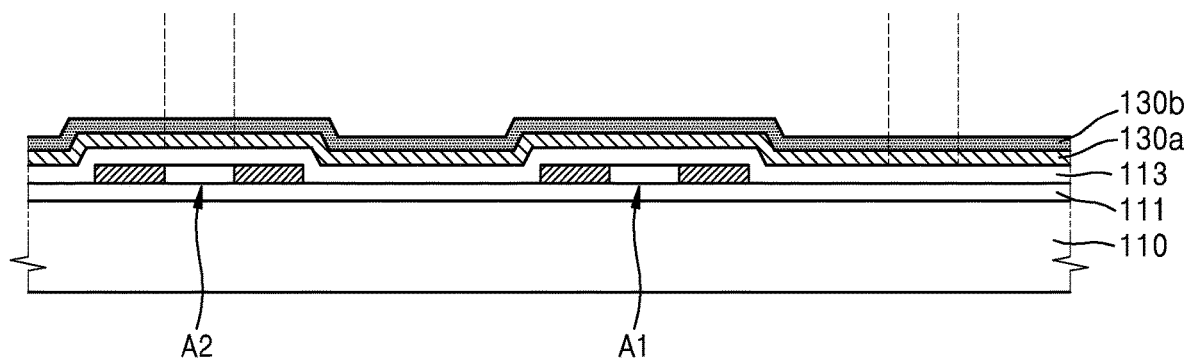

Referring to FIG. 10B, the preliminary-semiconductor layer 120 may be patterned to obtain the first semiconductor layer A1 and the second semiconductor layer A2, and the first gate insulating layer 113 may be formed on the entire surface of the substrate 110 to cover or overlap the first semiconductor layer A1 and the second semiconductor layer A2 and then the second gate electrode G2 and the lower electrode CE1 of the storage capacitor Cst may be formed on the first gate insulating layer 113.

The first gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), and may be formed by a deposition method such as the chemical vapor deposition (CVD) method, the sputtering method, for example, however, the disclosure is not limited thereto.

The second gate electrode G2 and the lower electrode CE1 of the storage capacitor Cst may include the same material, and may respectively include the fourth lower layer GL4 and the fourth upper layer GH4 that may be stacked and the first lower layer GL1 and the first upper layer GH1 that may be stacked.

A first metal layer 130a and a second metal layer 130b may be formed and patterned on the entire surface of the substrate 110 in order to form the second gate electrode G2 and the lower electrode CE1 of the storage capacitor Cst. The first metal layer 130a and the second metal layer 130b may be generated by the deposition method such as a chemical vapor deposition method, a plasma enhanced CVD (PECVD) method, a low pressure CVD (LPCVD) method, a physical vapor deposition (PVD) method, a sputtering method, an atomic layer deposition (ALD) method, for example, however, the deposition method is not limited thereto.

Figure 10C:
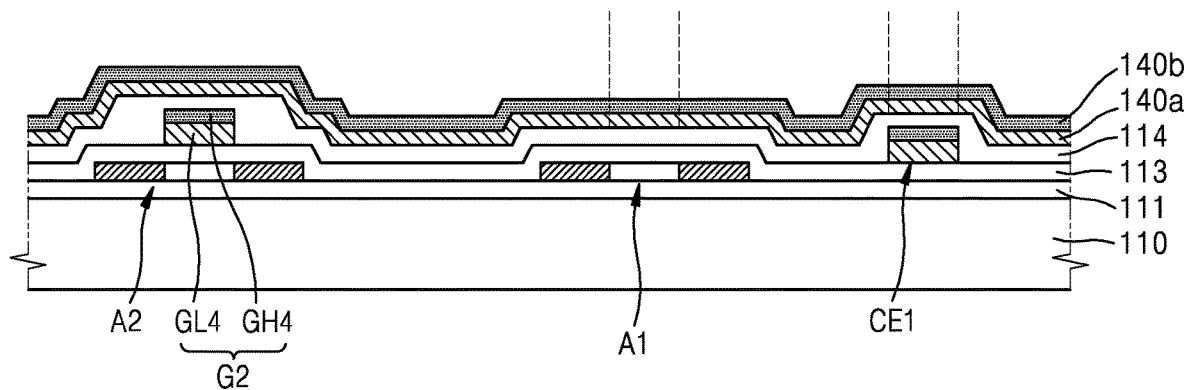

Referring to FIG. 10C, the second gate insulating layer 114 may be formed on the entire surface of the substrate 110 to cover or overlap the second gate electrode G2 and the lower electrode CE1 of the storage capacitor Cst, and then the first gate electrode G1 and the upper electrode CE2 of the storage capacitor Cst may be formed on the second gate insulating layer 114.

The second gate insulating layer 114 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), and may be formed by a deposition method such as the chemical vapor deposition (CVD) method, the sputtering method, for example, however, the disclosure is not limited thereto.

The first gate electrode G1 and the upper electrode CE2 of the storage capacitor Cst may include the same material and may respectively include the third lower layer GL3 and the third upper layer GH3 that may be stacked and the second lower layer GL2 and the second upper layer GH2 that may be stacked.

A third metal layer 140a and a fourth metal layer 140b may be formed and patterned on the entire surface of the substrate 110 to form the first gate electrode G1 and the upper electrode CE2 of the storage capacitor Cst. The third metal layer 140a and the fourth metal layer 140b may be generated by the deposition method such as a chemical vapor deposition method, a plasma enhanced CVD (PECVD) method, a low pressure CVD (LPCVD) method, a physical vapor deposition (PVD) method, a sputtering method, an atomic layer deposition (ALD) method, for example, however, the deposition method is not limited thereto.

Figure 10D:
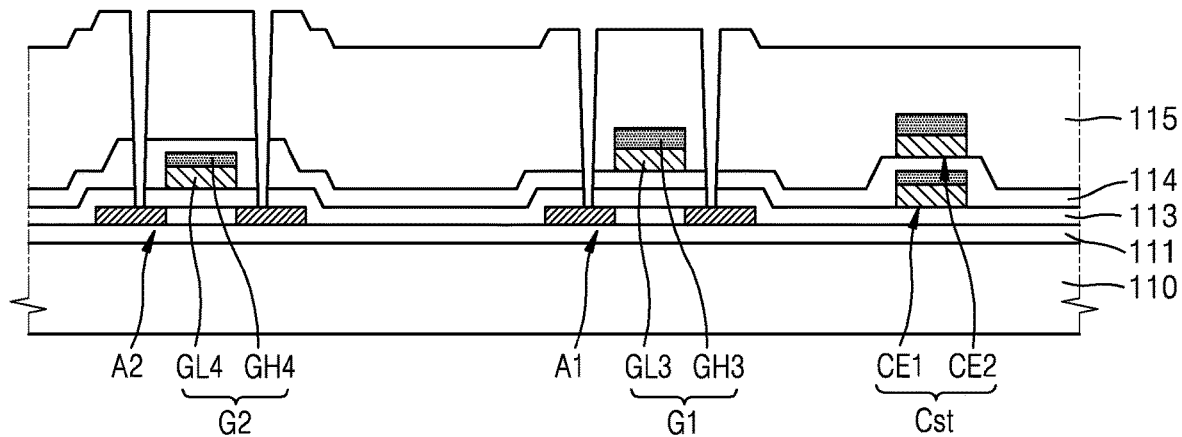

Referring to FIG. 10D, the interlayer insulating layer 115 may be formed on the entire surface of the substrate 110 to cover or overlap the first gate electrode G1 and the upper electrode CE2 of the storage capacitor Cst, and contact holes exposing source regions and/or drain regions of the first and second semiconductor layers A1 and A2 may be formed. After that, metal layers embedded in the contact holes may be formed and patterned to form the source electrodes S1 and S2 and/or the drain electrodes D1 and D2.

The interlayer insulating layer 115 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), and may be formed by a deposition method such as the chemical vapor deposition method, the sputtering method, for example, however the disclosure is not limited thereto.

The source electrodes S1 and S2 and the drain electrodes D1 and D2 may each include a conductive material including molybdenum (Mo), aluminum (Al), copper (Cu), titanium (Ti), for example, and may have a single-layered or multi-layered structure including the above-noted materials. For example, the source electrodes S1 and S2 and the drain electrodes D1 and D2 may each have a multi-layered structure including Ti/Al/Ti.

Figure 10E:
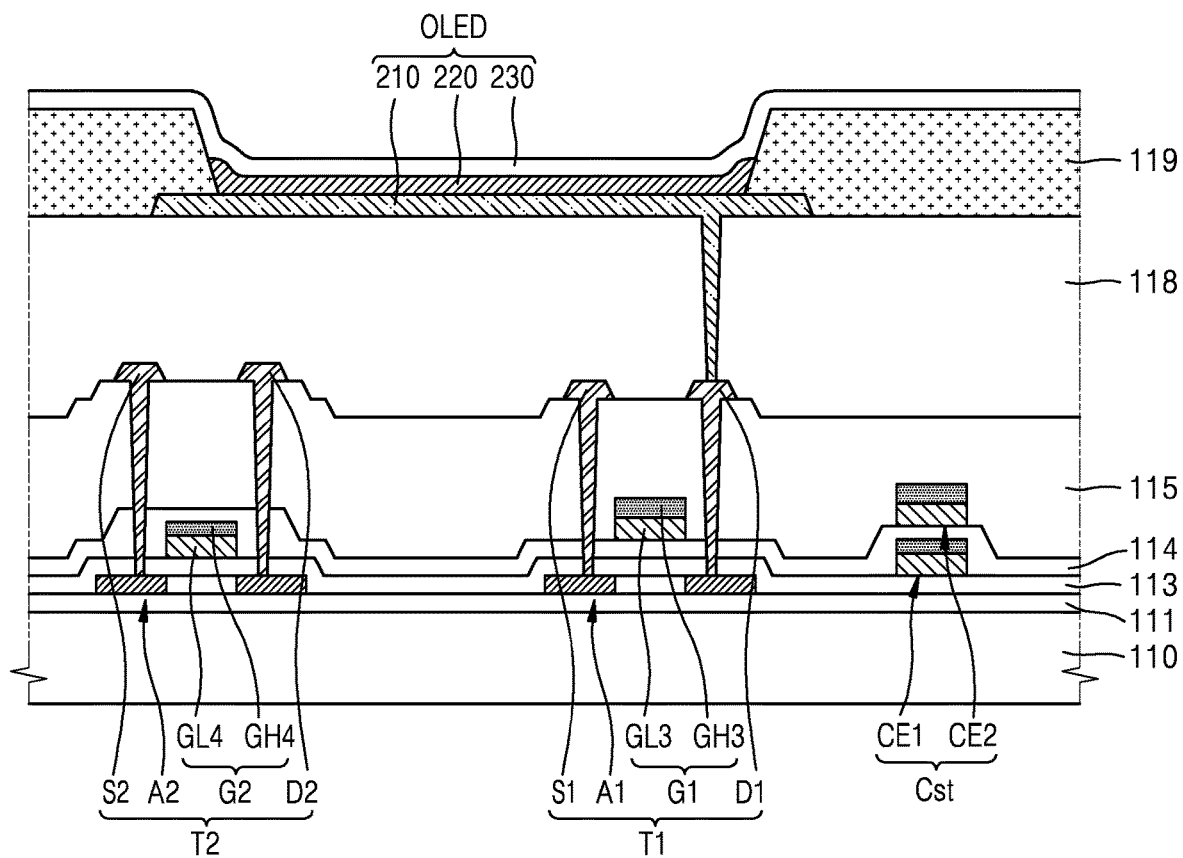

Referring to FIG. 10E, the planarization layer 118 may be formed on the interlayer insulating layer 115, and the organic light-emitting diode OLED may be formed on the planarization layer 118.

The planarization layer 118 may include a single-layered or multi-layered structure including an organic material or an inorganic material. The planarization layer 118 may include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The planarization layer 118 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), for example, within the spirit and the scope of the disclosure. After arranging or disposing the planarization layer 118, a chemical and mechanical polishing may be performed to provide a flat upper surface.

According to the display apparatus of an embodiment, the first upper layer GH1 may include tantalum (Ta) and the first lower layer GL1 may include aluminum (Al) or an aluminum alloy, and then, generation of defects due to increase in the thickness may be prevented and the resistance per unit area ($cm^2$) after the heat treatment may be rather reduced. Corrosion caused by hydrogen fluoride (HF) in the subsequent buffer oxide etch (BOE) process may be prevented by tantalum (Ta), and generation of hillock of aluminum (Al) included in the first lower layer GL1 and diffusion of metal components at the interface during the subsequent annealing process may be prevented.

According to an embodiment, the display apparatus having improved resistance of the gate electrode of the thin film transistor and/or the storage capacitor may be implemented. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus, comprising:
   a substrate;
   a thin film transistor on the substrate, the thin film transistor including:
      a first semiconductor;
      a first gate electrode overlapping the first semiconductor layer; and
      a first gate insulating layer disposed between the first semiconductor layer and the first gate electrode;
   a storage capacitor including:
      a lower electrode including a first lower layer and a first upper layer stacked on each other;
      an upper electrode including a second lower layer and a second upper layer stacked each other, the upper electrode overlapping the lower electrode;
      a second gate insulating layer disposed directly between the upper electrode and the lower electrode; and
   a display element electrically connected to the thin film transistor, wherein
   the second upper layer has a thickness greater than a thickness of the first upper layer.

2. The display apparatus of claim 1, wherein
   the lower electrode and the first gate electrode include a same material.

3. The display apparatus of claim 1, wherein
   the thickness of the first upper layer is in a range of about 40 nm to about 60 nm, and the thickness of the second upper layer is in a range of about 40 nm to about 140 nm.

4. The display apparatus of claim 1, wherein at least one of the first lower layer and the second lower layer has a thickness in a range of about 130 nm to about 1000 nm.

5. The display apparatus of claim 1, wherein the first upper layer and the second upper layer include tantalum (Ta).

6. The display apparatus of claim 1, wherein the upper electrode overlaps the thin film transistor.

7. The display apparatus of claim 1, further comprising a thin film encapsulation layer or an encapsulation substrate on the substrate, the thin film encapsulation layer or the encapsulation substrate facing the substrate.

8. The display apparatus of claim 1, wherein the first lower layer and the second lower layer each include an aluminum alloy including aluminum (Al) and a first element, and an amount of the first element is about 0.1 at % or less.

9. The display apparatus of claim 8, wherein the first element is selected from the group consisting of nickel (Ni), palladium (Pd), platinum (Pt), darmstadtium (Ds), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

10. The display apparatus of claim 8, wherein
the aluminum alloy includes a second element that is different from the first element, and
a total amount of the first element and the second element is about 0.1 at % or less.

11. The display apparatus of claim 10, wherein
the first element is selected from the group consisting of nickel (Ni), palladium (Pd), platinum (Pt), and darmstadtium (Ds), and the second element is selected from the group consisting of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

12. A display apparatus, comprising:
a substrate;
a thin film transistor on the substrate, the thin film transistor including:
 a first semiconductor layer;
 a first gate electrode overlapping the first semiconductor layer; and
 a first gate insulating layer disposed between the first semiconductor layer and the first gate electrode;
a storage capacitor including:
 a lower electrode including a first lower layer and a first upper layer stacked on each other,
 an upper electrode including a second lower layer and a second upper layer stacked each other, the upper electrode overlapping the lower electrode, wherein the lower electrode is spaced apart from the upper electrode; and
a display element electrically connected to the thin film transistor, wherein
the second upper layer has a thickness greater than a thickness of the first upper layer.

13. The display apparatus of claim 12, wherein the first lower layer and the second lower layer each include an aluminum alloy including aluminum (Al) and a first element, and an amount of the first element is about 0.1 at % or less.

* * * * *